(12) United States Patent
Hersee

(10) Patent No.: US 9,106,056 B1
(45) Date of Patent: Aug. 11, 2015

(54) PHASE-COUPLED ARRAYS OF NANOWIRE LASER DEVICES AND METHOD OF CONTROLLING AN ARRAY OF SUCH DEVICES

(71) Applicant: Stephen D. Hersee, Summerland Key, FL (US)

(72) Inventor: Stephen D. Hersee, Summerland Key, FL (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 14/103,587

(22) Filed: Dec. 11, 2013

Related U.S. Application Data

(63) Continuation-in-part of application No. 12/880,923, filed on Sep. 13, 2010, now Pat. No. 8,624,968, and a continuation-in-part of application No. 12/103,920, filed on Apr. 16, 2008.

(60) Provisional application No. 61/276,400, filed on Sep. 11, 2009, provisional application No. 60/913,927, filed on Apr. 25, 2007, provisional application No. 60/973,465, filed on Sep. 19, 2007.

(51) Int. Cl.
*H01S 5/34* (2006.01)
*H01S 5/343* (2006.01)
*H01S 5/40* (2006.01)
*B82Y 20/00* (2011.01)

(52) U.S. Cl.
CPC .............. *H01S 5/34333* (2013.01); *H01S 5/34* (2013.01); *H01S 5/4025* (2013.01); *B82Y 20/00* (2013.01); *Y10S 977/951* (2013.01)

(58) Field of Classification Search
CPC ......... H01S 5/042; H01S 5/0425; H01S 5/34; H01S 5/341; H01L 21/02606; H01L 29/413; H01L 2221/1094; H01L 25/075; H01L 25/0753; H01L 33/26; H01L 33/36
USPC .................................. 372/38.1, 39, 50.12, 92
See application file for complete search history.

(56) References Cited

U.S. PATENT DOCUMENTS 7,508,505 B2    3/2009   Lustenberger et al.
8,624,968 B1 *  1/2014   Hersee et al. .................. 348/80
(Continued)

OTHER PUBLICATIONS

J.J. Pan et al., "Adaptive semiconductor-laser phased-arrays for real-time multiple access communications," SPIE vol. 1476 Optical Technology for Microwave Applications V, 1991, pp. 157-169.

(Continued)

*Primary Examiner* — Armando Rodriguez
(74) *Attorney, Agent, or Firm* — MH2 Technology Law Group, LLP

(57) ABSTRACT

According to various embodiments, the present teachings include an array of nanowire devices. The array of nanowire devices comprises a readout integrated circuit (ROIC). An LED array is disposed on the ROIC. The LED array comprises a plurality of LED core-shell structures, with each LED core-shell structure comprising a layered shell enveloping a nanowire core, wherein the layered shell comprises a multi-quantum-well (MQW) active region. The LED array further comprises a p-side electrode enveloping the layered core-shell structure and electrically connecting the ROIC, wherein each p-side electrode has an average thickness ranging from about 100 nm to about 500 nm. A dielectric layer is disposed on the plurality of LED core-shell structures, with each nanowire core disposed through the dielectric to connect with an n-side semiconductor that is situated on the dielectric.

17 Claims, 11 Drawing Sheets

(56) References Cited

U.S. PATENT DOCUMENTS

| | | |
|---|---|---|
| 2005/0047172 A1 | 3/2005 | Sander |
| 2005/0271548 A1 | 12/2005 | Yang et al. |
| 2006/0082297 A1 | 4/2006 | Camp |
| 2006/0284303 A1 | 12/2006 | Tokida |
| 2007/0052660 A1 | 3/2007 | Montbach et al. |
| 2007/0207061 A1 | 9/2007 | Yang et al. |
| 2007/0211460 A1 | 9/2007 | Ravkin |
| 2008/0036038 A1* | 2/2008 | Hersee et al. ............. 257/615 |
| 2008/0271777 A1 | 11/2008 | Stoner et al. |
| 2009/0114900 A1 | 5/2009 | Udagawa |
| 2009/0309135 A1 | 12/2009 | Udagawa |
| 2010/0207040 A1 | 8/2010 | Tanaka et al. |

OTHER PUBLICATIONS

Hersee et. al, "MOVPE Growth of GaN Nanowires and their Electrical, Optical and LED Characteristics," SDH: ICMOVPE, Jun. 2008, pp. 1-39.

J. Banerji et al., "Phased array 1-to-N-way resonator with a convex mirror for phase conjugation," Applied Optics, vol. 44, No. 16, Jun. 1, 2005, pp. 3364-3369.

E. Kapon et al., "Longitudinalmode control in integrated semiconductor laser phased arrays by phase velocity matching," Applied Physics Letters, vol. 44, No. 2, Jan. 15, 1984, pp. 157-159.

* cited by examiner

100A

100B

PHASE-COUPLED ARRAYS OF NANOWIRE LASER DEVICES AND METHOD OF CONTROLLING AN ARRAY OF SUCH DEVICES

RELATED APPLICATIONS

This application is a continuation-in-part of U.S. patent application Ser. No. 12/880,923 entitled "Lens-less Digital Microscope," filed Sep. 13, 2010, which claims priority from U.S. Provisional Patent Application Ser. No. 61/276,400, filed Sep. 11, 2009, and which is also a continuation-in-part of U.S. patent application Ser. No. 12/103,920, entitled "Solid State Microscope," filed Apr. 16, 2008, which claims priority to U.S. Provisional Patent Application Ser. No. 60/913,927, filed Apr. 25, 2007, and Ser. No. 60/973,465, filed Sep. 19, 2007, all of which are hereby incorporated by reference in their entirety.

GOVERNMENT RIGHTS

This invention was made with government support under Contract No. EEC0812056 awarded by the National Science Foundation (NSF), and under Contract No. HR0011-05-1-0006 awarded by the Defense Advanced Research Projects Agency (DARPA). The Government has certain rights in the invention.

FIELD OF THE INVENTION

This invention relates generally to solid-state nanowire laser devices, methods for fabricating phase-coupled arrays of nanowire laser devices and methods of operating an array of such devices.

BACKGROUND OF THE INVENTION

When a GaN nanowire LED is operated at high current density the light output of the LED will change from spontaneous to stimulated emission. That is, the nanowire LED will become a nanowire laser. Stimulated emission (lasing) in GaN nanowires was reported in an invited paper at ICMOVPE XIV (Fourteenth International Conference on Metalorganic Vapor Phase Epitaxy) Metz, France, 1-6 Jun. 2008, paper Tu-I.1, the disclosure of which is hereby incorporated by reference in its entirety.

Arrays of phase-coupled nanowires have been proposed. Two such examples are discussed in J. J. Pan, et al., Proc. SPIE 1476, 157 (1991) and J. Banerji, et al., Appl. Optics 44, 3364 (2005). However, research into phase-coupled arrays of (non-nanowire) semiconductor lasers has been thus far largely theoretical. One article shows lasers experimentally limited to simple longitudinal-mode control on laser bars with widths on the order of hundreds of microns. E. Kapon et al., *Appl. Phys. Lett.* 44, 157 (1984).

Previous approaches to phase coupling of nanowire lasers have used external (non-integrated) components. This can tend to make the overall system prone to drift and instability.

It would be considered a step forward in the art to provide a phase coupling pathway that is robustly integrated into the laser structure and/or that promotes improved stability of operation. It would further be considered a step forward in the art to provide for integration of components that allow active control of phase changes in light transmitted between laser devices in an array.

SUMMARY OF THE INVENTION

According to various embodiments, the present teachings include an array of nanowire devices. The array of nanowire devices comprises a readout integrated circuit (ROIC). An LED array is disposed on the ROIC. The LED array comprises a plurality of LED core-shell structures, with each LED core-shell structure comprising a layered shell enveloping a nanowire core, wherein the layered shell comprises a multi-quantum-well (MQW) active region. The LED array further comprises a p-side electrode enveloping the layered core-shell structure and electrically connecting the ROIC, wherein each p-side electrode has an average thickness ranging from about 100 nm to about 500 nm. A dielectric, is disposed on the plurality of LED core-shell structures, with each nanowire core disposed through the dielectric to connect with an n-side semiconductor that is situated on the dielectric.

Another embodiment of the present disclosure is directed to a method of forming an array of nanowire devices. Each nanowire device is configured to exhibit lasing action when operated at increased current density. The array of nanowire devices comprises forming an LED array comprising a plurality of LED core-shell structures. Each LED core-shell structure comprises: a doped buffer layer disposed on a substrate, a first dielectric, disposed on the doped buffer layer, a nanowire core formed on the doped buffer layer through the first dielectric, and a layered shell formed to envelop the nanowire core, wherein the layered shell comprises a multi-quantum-well (MQW) active region. The method of forming the array of nanowire devices further comprises forming a p-side semiconductor to envelop the layered shell of each LED core-shell structure. A p-side electrode is formed having a thickness ranging from about 100 nm to about 500 nm to envelop the p-side semiconductor. A second dielectric material is formed between adjacent p-side electrodes for an electrical isolation, providing a surface comprising both the p-side electrodes and the second dielectric material. The nanowire laser array is inverted to attach the surface comprising both the p-side electrodes and the second dielectric material to a readout integrated circuit (ROIC). The substrate of the nanowire laser array is removed to expose the doped buffer layer. The doped buffer layer is patterned to form a plurality of n-side semiconductors on the dielectric, with each n-side semiconductor connecting with the nanowire core of a corresponding LED core-shell structure.

Yet another embodiment of the present disclosure is directed to a method of operating a phase-coupled array of nanowire devices. The method comprises providing an array of the nanowire devices as described herein. Power is supplied to the array of nanowire devices sufficient to cause the nanowire devices to exhibit lasing action.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1A:
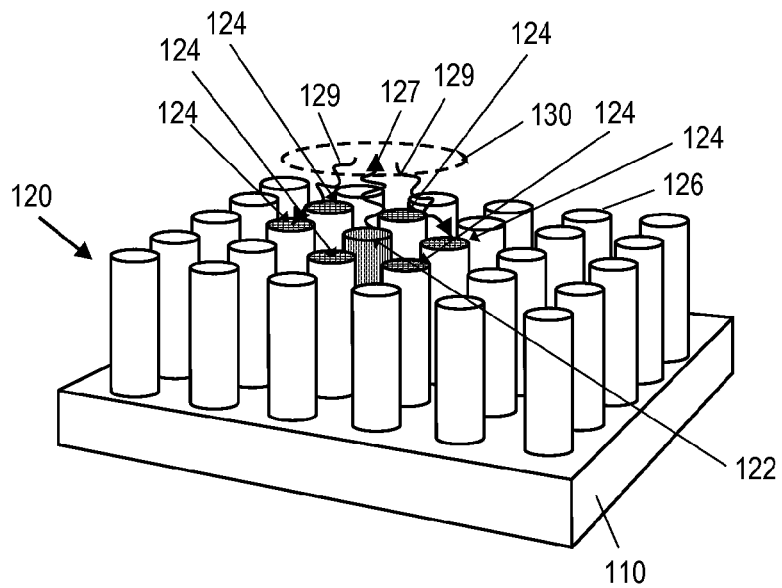
FIG. 1A depicts an exemplary LED (light emitting diode) system having an LED array in accordance with various embodiments of the present teachings.

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Exemplary embodiments provide solid-state microscope devices and methods for forming and using them. The solid-state microscope devices can include a light emitter array having a plurality of light emitters with each light emitter individually addressable. During operation, each light emitter can be biased in one of three operating states including an emit state, a detect state, and an off state. The light emitter can be an LED (light emitting diode) including, but not limited to, a nanowire-based LED or a planar LED, to provide various desired image resolutions for the microscope devices. In an exemplary embodiment for near-field microscopy, the imaging resolution can be approximately defined by a pitch p, i.e., a center-to-center spacing between adjacent light emitters, of the light emitter array.

In various embodiments, the light emitters, for example, the nanowire-based LED or the planar LED, and/or the microscope devices can be formed using a III-V compound semiconductor materials system, such as, a Group III-N compound materials system including one or more materials of GaN, AlN, InN, InGaN, AlInGaN, AlGaN, InP, GaAs, and a combination thereof.

In an exemplary embodiment, the light emitters can include a layered multi-quantum-well (MQW) structure having a MQW active region disposed between doped barrier layers. The MQW active region can include, for example, Group III-N quantum wells, such as InGaN/GaN quantum wells, AlGaN/GaN quantum wells, or other III-N quantum wells. For example, the MQW active region can include alternating layers of $Al_xGa_{1-x}N$ and GaN, or $In_xGa_{1-x}N$ and GaN, where x can be any number less than or equal to 1.00.

Various dopants can be used for the layered MQW structure or for the light emitters to provide a desired conductivity. The dopant can be, for example, a p-type dopant chosen from Group II of the periodic table (e.g. Mg, Zn, Cd or Hg); a p-type dopant chosen from Group IV of the periodic table, (e.g., C); or an n-type dopant chosen from a group consisting of Si, Ge, Sn, S, Se and Te.

The MQW active region can be disposed between a first doped layer, e.g., n-doped GaN or n-doped $Al_xGa_{1-x}N$, and a second doped layer, e.g., p-doped $Al_xGa_{1-x}N$. A third doped layer can also be formed on the second doped layer and can be formed of, for example, p-doped GaN.

In embodiments, the light emitters can include a substrate formed of a material including, but not limited to, sapphire, silicon carbide (SiC), silicon (Si), silicon-on-insulator (SOI), III-V semiconductor compounds such as GaN or GaAs, metal, ceramic, or glass.

The light emitters and/or the microscope devices can be formed by various crystal growth techniques including, but not limited to, metal-organic chemical vapor deposition (MOCVD) (also known as organometallic vapor phase epitaxy (OMVPE)), pulsed MOCVD, molecular-beam epitaxy (MBE), gas source MBE (GSMBE), metal-organic MBE (MOMBE), atomic layer epitaxy (ALE), and/or hydride vapor phase epitaxy (HVPE).

The dielectric materials can be involved in formation of the disclosed light emitters and/or microscope devices. For example, dielectric materials can be used for electrical isolation between the nanowire core-shell LEDs and/or planar LEDs, and for electrical isolation between the p-side electrodes (or n-side electrodes) of individual LEDs. The dielectric materials can also be used for a selective growth mask when forming nanowire-based structures or devices.

As used herein, the dielectric materials can include, but are not limited to, silicon dioxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), tantalum oxide ($TaO_2$) or other insulating materials.

In embodiments, conductive materials and structures can be used for forming the exemplary microscope devices. For example, conductive materials and structures can be used as bump bonds, electrodes, and/or electrical contacts. The conductive materials and structures can include metals such as indium (In), titanium (Ti), aluminum (Al), platinum (Pt), nickel (Ni) or gold (Au), for example, in a number of multi-layered combinations such as Al/Ti/Pt/Au, Ni/Au, Ti/Al, Ti/Au, Ti/Al/Ti/Au, and/or Ti/Al/Au using techniques known to one of ordinary skill in the art.

In various embodiments, the disclosed microscope devices can be light weight and small in size. For example, a microscope device can have a weight and size both less than 1/1000 of the weight and size of a conventional optical microscope. In addition, the disclosed microscope devices can be highly portable and robust with desired image resolutions. In embodiments, the lens-less digital microscope devices can be placed in chemical aggressive environments, underwater, or even be configured for in-vivo observation.

In one embodiment, the disclosed microscope devices can include a plurality of nano-photonic light emitting devices, such as nanowire-based LEDs, having an image resolution of about 1 micron or greater, for example, from about 1 micron to about 10 microns. In another embodiment, the disclosed microscope devices can include a planar LED array having an image resolution of about 10 microns to about 50 microns or greater. Note that the above resolution values are "raw" values that do not include improvements gained by subsequent digital processing that is known to one of ordinary skill in the related art. In various embodiments, the subsequent digital processing of the data from these microscope devices can take place in a connected computer control system to further improve the above resolution values. For example, the image resolution, after the digital processing, can range from about 1 μm to about 100 μm, although the image resolution is not limited according to various embodiments of the present teachings.

FIG. 1A is a schematic of an exemplary light emitter system 100A in accordance with various embodiments of the present teachings. It should be readily apparent to one of ordinary skill in the art that the system 100A depicted in FIG. 1A represents a generalized schematic illustration and that other layers/light emitters can be added or existing layers/light emitters can be removed or modified.

As shown, the exemplary light emitter system 100A can include a plurality of light emitters 122, 124, or 126, which can be configured as a light emitter array 120 over a substrate 110. Sample object 130 placed over the light emitter array 120 can thus be viewed and/or examined as a magnified image.

The substrate 110 can be, e.g., any substrate on which Group III-N materials or other light-emitting semiconductors can be grown. The substrate 110 can include, but is not limited to, Si, SiC, Sapphire, GaN and/or GaAs.

The light emitters 122, 124, or 126 can include, for example, a nanowire-based LED, a planar LED, or any other suitable light emitters depending on the microscopic applications. In various embodiments, each light emitter can be biased in one of three operating states including an emit state, a detect state, and an off state, in order to operate the system 100A. For example, as shown in FIG. 1A, the plurality of light emitters can include sets of light emitters including a first set of the light emitters 122 surrounded by a second set of light emitters 124, and a third set of light emitters 126. In various embodiments, each set of light emitters can include one or more light emitters.

The light emitter system 100A can build a digital image using a reflection mechanism and/or a transmission mechanism. In embodiments for reflection based operations, the first set of light emitters 122 can be "on" emitters that can illuminate a small area of the sample object 130. For example, the small area can have an area on an order of $\mu m^2$. The emitted light 127 from the "on" light emitters 122 can then be reflected, scattered, and/or diffracted from the sample object 130 and the returned light, e.g., the reflected light 129, can then be collected immediately by the surrounding set of light emitters 124, which are electrically reverse-biased to function as photo-detectors. The first set of emitters 122 can be forward biased so that they emit light. The third set of light emitters 126, i.e., the remaining light emitters of the light emitter array 120 can be unbiased, e.g., switched off during this step.

The image resolution of the light emitter system 100A can correspond to the size of the illuminated light spot on the sample object 130. The size of the illuminated spot (not illustrated) can correspond approximately to the pitch p of the light emitter array 120 and also depend on how much diffraction, reflection, and/or absorption occur in the sample object 130. As shown, the plurality of light emitters 122, 124, 126 can possess a controllable pitch p and thus to control the resulting image resolution. In some embodiments, the light emitter array 120 can be in a high density having a pitch p, e.g., of about 1 micron to 10 microns for an image resolution of about 10 microns or less. In other embodiments, the pitch p can be, for example, in a range of about 10 microns to about 50 microns, or greater, according to an image resolution requirement.

In an exemplary embodiment for the reflection type mechanism, several "rings" of light emitters 124 can surround one light emitter 122 and can be biased as detectors to detect the reflected light 129 from the illuminated spot on the sample object 130, wherein the sample object is illuminated by the light emitter 122.

In another exemplary embodiment for operations that involve transmission mechanism, a conventional photodetector (not shown in FIG. 1A) can be placed above the sample object 130. Such photodetector can have large area for detecting the transmitted light through an optically clear sample object 130. For example, one light emitter 122 can be biased as an "on" emitter that can illuminate a small area of the sample object 130. The emitted light 127 from the "on" light emitter 122 can be transmitted through the sample object 130 and the transmitted light (not illustrated in FIG. 1A) can then be collected immediately by the photodetector placed thereabove.

Figure 8A:
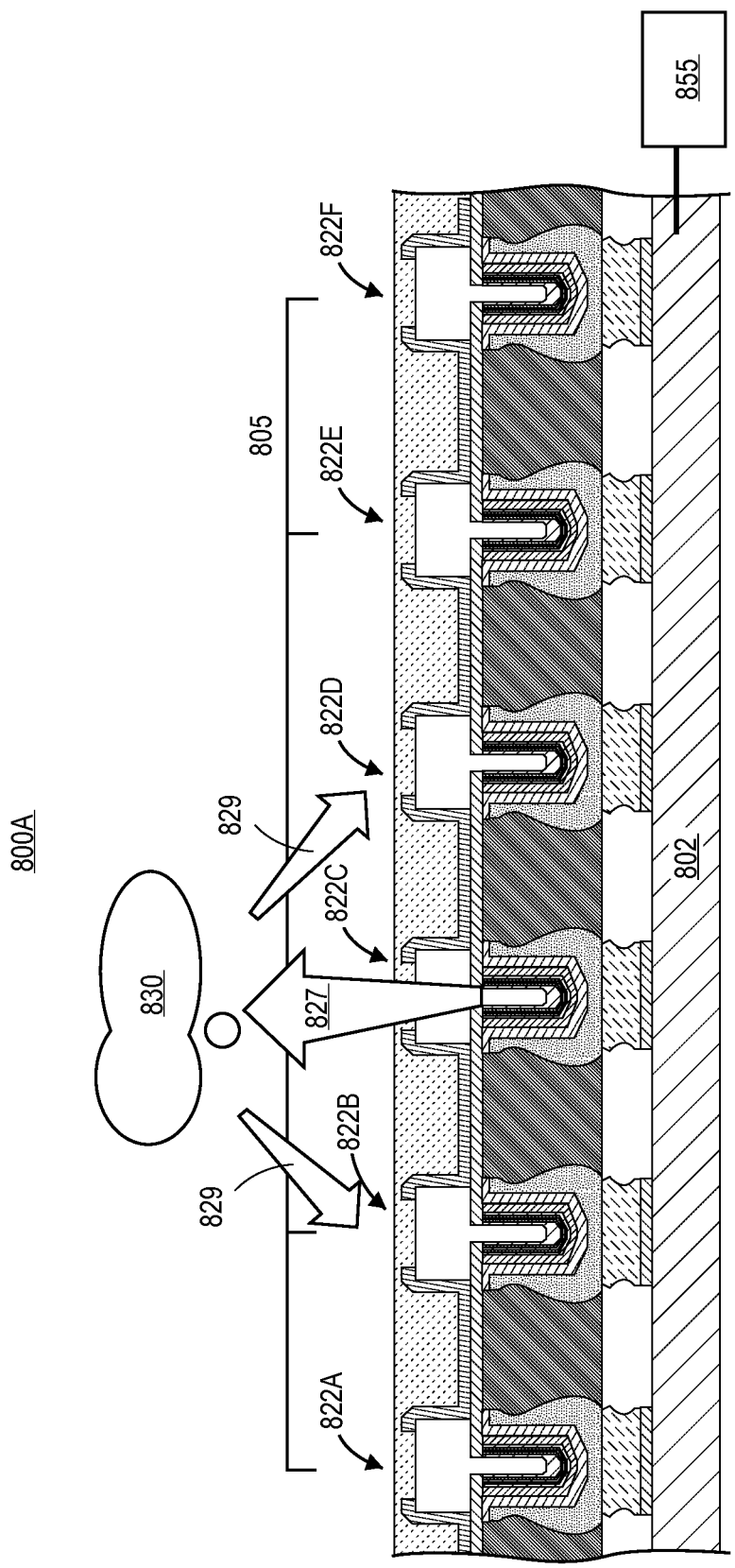
FIGS. 8A-8B depict exemplary microscope imaging systems in accordance with various embodiments of the present teachings.
Figure 8B:
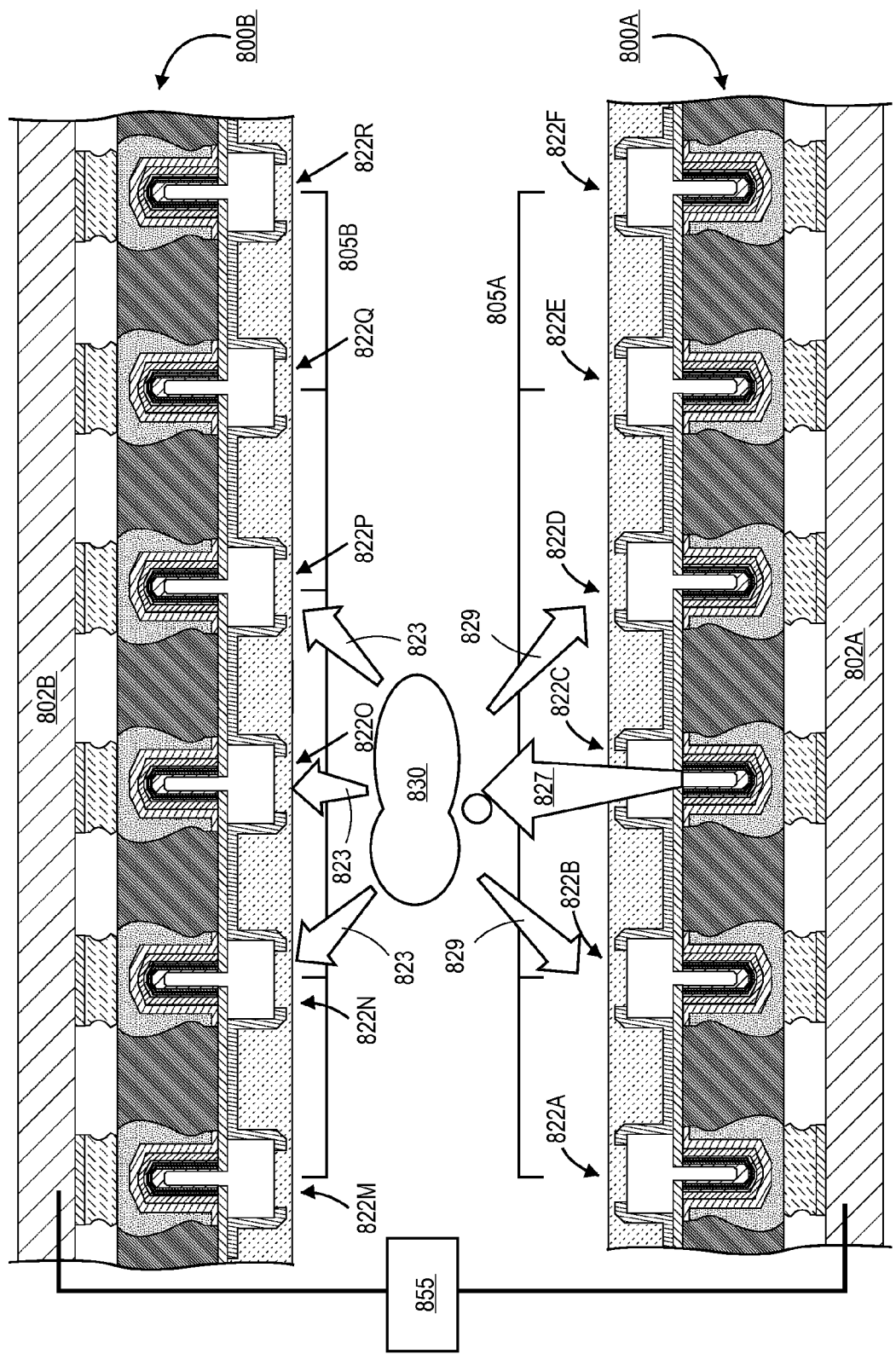

In a third exemplary embodiment, a detector array having a detector pitch that is identical to the pitch p of the LED emitter array, can be placed above the emitter array (see FIG. 8B). The spacing between the underlying emitter array and the overlying detector array can be adjusted and used to define a channel. The height of this channel can further be adjusted to provide a degree of filtering of a specimen, allowing only objects with a size smaller than the channel height to enter the viewing area. The resolution of this arrayed emitter plus arrayed detector arrangement can be superior to that of the two previous single emitter array embodiments described above and can be used, for example, to create pseudo-3D microscope images.

Figure 1B:
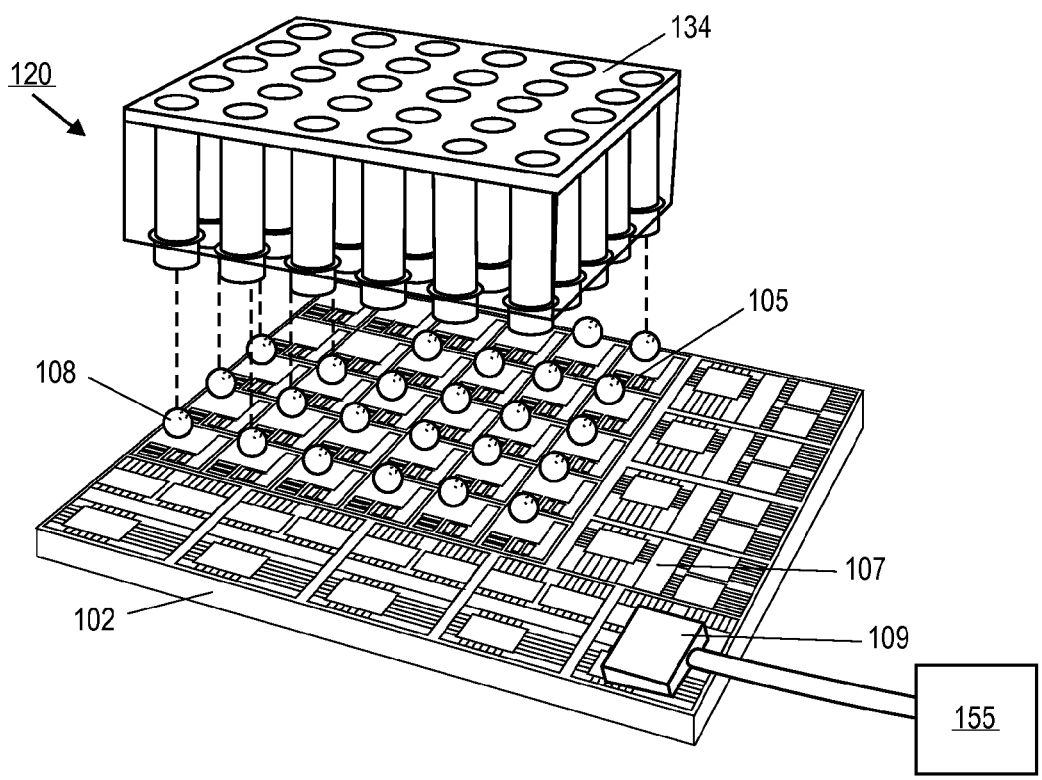
FIG. 1B depicts an exemplary microscope device in accordance with various embodiments of the present teachings.

FIG. 1B is a schematic for an exemplary microscope device 100B in accordance with the present teachings. It should be readily apparent to one of ordinary skill in the art that the device 100B depicted in FIG. 1B represents a generalized schematic illustration and that other layers/light emitters/circuit cells can be added or existing layers/light emitters/circuit cells can be removed or modified.

As shown, the device 100B can include the microscope light emitter array 120 connected with a CMOS integrated circuit 102 through a plurality of bump bonds 108. The CMOS integrated circuit 102 can be a read out integrated circuit (ROIC) including a plurality of ROIC cells 105 and peripheral circuits 107. The light emitter array 120 can further include a plurality of electrical contacts 132 and 134 used as p-side electrodes and n-side electrodes for the light emitters in the array 120. For example, each light emitter in the array 120 can be connected to a corresponding ROIC cell 105 through one bump bond 108. The plurality of ROIC cells 105 can thus be configured having the same pitch p as that for the light emitter array 120 in FIG. 1A.

In various embodiments, the disclosed microscope configuration can build a magnified pixel-by-pixel digital image of the sample object. Specifically, the action of switching on one (or more) light emitter (e.g., the light emitter 122) in the plurality of light emitters, and detecting and storing the intensity of the reflected or transmitted light from the sample object, can create one pixel in the digital image. For example, the photocurrent of the light detectors (e.g., the light emitters 124 in FIG. 1A) in the light emitter array 120 can be summed by, for example, related ROIC cells 105 and transferred at 109 to a control computer 155 to fix the intensity of the first pixel. In one embodiment, the control computer 155 can receive image data via a hi-speed connection and the image can be reconstructed and displayed on the control computer.

Following the creation of the first pixel in the digital image, the light emitter 122 can then be switched off, one of its neighboring light emitters can be switched on, and the operation procedure can be repeated to build up a second pixel in the digital image. This process can be repeated across the area of light emitter array 120 to build the full digital image of the sample object 130. In various embodiments, for objects close to the array surface, the image resolution can be similar to the pitch p between adjacent light emitters.

The peripheral circuits 107 can be used for multiplexing and transferring data from the ROIC cells 105 to the control computer 155. For example, after the image has been collected by some of the light emitters (e.g., 124) in the array 120, various image data manipulation algorithms can be applied to the resulting digital images. Patterns within the image, the image contrast or other image parameters, can be recognized and/or controlled. Unlike conventional optical microscope, the disclosed microscope algorithms can further process the image data in a real-time feedback loop, which can manipulate the switching sequence or switching speed of the individual light emitter to optimize image resolution, enhance specific regions of the image, etc. Due to the sequential switching of light emitters, the microscope devices can provide an average illumination power onto the sample object, which is particularly advantageous for examining biological samples (e.g., living cells) that may be irreversibly degraded by over-illumination. The image resolution can also be improved through advanced digital-imaging processes, some of which are known to one skilled in the art, and additional imaging processes that form the basis of claims discussed below.

Further, the light emitters, such as the LEDs, can be constructed to emit light with a specific wavelength, e.g., chosen to excite a specific mechanism or process in the sample object. For example, various fluorescent dyes or other fluorophores can be used to "stain" specific parts of living cells. The disclosed microscope system 100A can emit a specific wavelength to excite a specific fluorescence in these certain fluorophores. In various embodiments, each light emitter used in the microscope system can be an individually addressable light emitter to provide a specific emission wavelength. With the use of advanced fluorophores, such as NQDs (nanoscale quantum dots) that can be excited by a wide range of wavelengths yet emit only over a narrow wavelength band, various different fluorescences in one sample object can be examined by a single microscope device.

Figure 2:
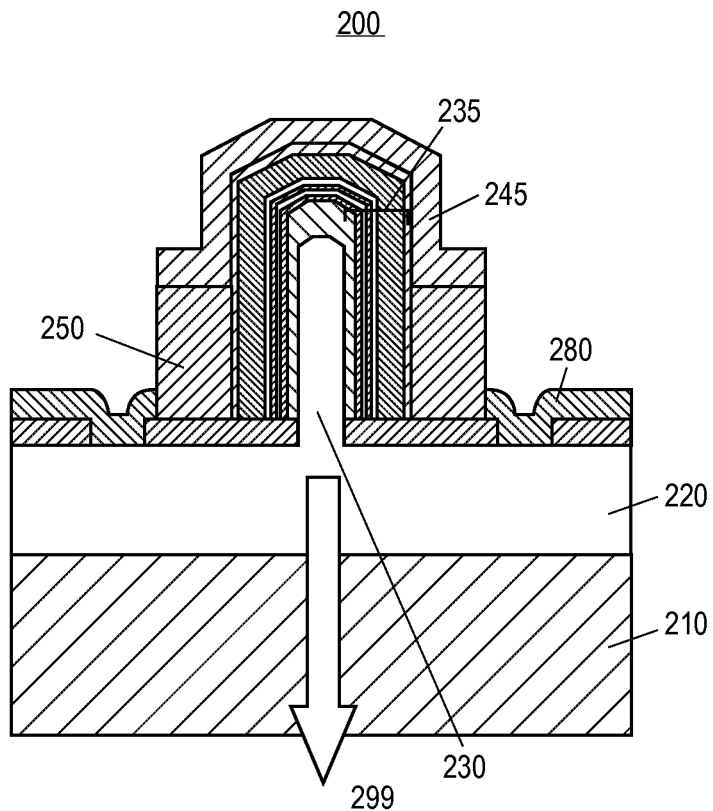
FIG. 2 depicts an exemplary nanowire-based LED structure in accordance with various embodiments of the present teachings.

FIG. 2 depicts an exemplary light emitter 200 that includes a nanowire core-shell structure in accordance with the present teachings. In various embodiments, the exemplary light emitter 200 can be the nanowire devices as described in the related U.S. patent application Ser. No. 11/684,264, entitled "Pulsed Growth of Catalyst-Free Growth of GaN Nanowires and Application in Group III Nitride Semiconductor Bulk Material," which is hereby incorporated by reference in its entirety.

For example, the device 200 can include a layered shell 235 having a MQW "shell" structure formed on the sidewalls of a nanowire core 230. The MQW core-shell structure can be formed over a doped buffer layer 220 over a substrate 210. It should be readily apparent to one of ordinary skill in the art that the device 200 depicted in FIG. 2 represents a generalized schematic illustration and that other nanowires/layers/shells can be added or existing nanowires/layers/shells can be removed or modified.

As shown, the substrate 210 can be a substrate including, but not limited to, sapphire, silicon carbide, silicon and III-V substrates such as GaAs, or GaN. The doped buffer layer 220 can be formed over the substrate 210. The doped buffer layer 220 can be formed of, for example, GaN, AlN, InN, AlGaN, InGaN or AlInGaN, by various crystal growth methods. In various embodiments, the doped buffer layer 220 can be doped with a conductivity type similar to the doped nanowire core 230.

The nanowire 230 can have an elongated conductive or semiconductive material that includes at least one minor dimension, for example, one of the cross-sectional dimensions such as width or diameter, of less than or equal to about 1000 nm. The nanowires can have an aspect ratio (e.g., length:width and/or major dimension:minor dimension) of about 1 or greater. The nanowires can have various cross-sectional shapes, such as, for example, a rectangular, polygonal, square, oval, or circular shape. The doped nanowire 230 can be formed of, for example, GaN, AlN, InN, AlGaN, InGaN or AlInGaN, which can be made an n-type by doping with various impurities such as silicon, germanium, selenium, sulfur and tellurium or a p-type by introducing beryllium, strontium, barium, zinc, or magnesium.

It is also intended that the term "nanowires" encompasses other elongated structures of like dimensions including, but not limited to, nanoshafts, nanopillars, nanoneedles, nanorods, and nanotubes (e.g., single wall nanotubes, or multiwall nanotubes), and their various functionalized and derivatized fibril forms, such as nanofibers in the form of thread, yarn, fabrics, etc.

In various embodiments, a p-side electrode 245 can be formed on dielectric materials 250 to envelop a portion of the shelled layer 235 such that the p-side electrode 245 can be electrically isolated from adjacent n-side electrodes 280 by the dielectric materials 250, when a number of core-shell structures are included in a large area such as a wafer. The dielectric materials 250 can be formed over the doped buffer layer 220 and on a portion of the sidewalls of the layered shell 235. In addition, n-side electrodes 280 can be formed to assure the conduction between the n-side contact (e.g., the doped buffer layer 220) and the central conductive region including the nanowire core 230.

At 299 in FIG. 2, the emitted light of the nanowire-based LED 200 in FIG. 2 can be extracted through the substrate 220, which can be transparent at the emitted light wavelengths. Alternatively, light output can occur on the top side of the device 200 (not shown). Since the nanowire-based LED device 200 has a small diameter that is comparable or even less than the wavelength of emitted light, a diffracted, diffuse light output can be expected. While this diffuse light output can be advantageous in solid-state lighting applications, a more collimated light beam can be obtained by a thicker metal electrode (not shown) that would form a collimation tube.

Although a single nanowire is depicted in FIG. 2 for the purpose of description, one of ordinary skill in the art will understand that a number of nanowires can be formed simultaneously with a high density in a large area (e.g., a whole wafer).

Figure 3:
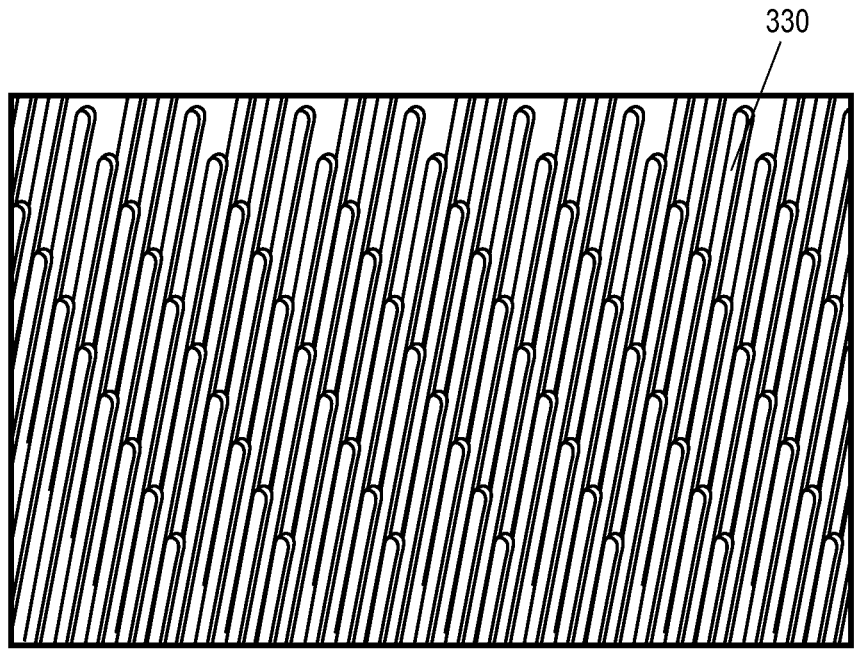
FIG. 3 depicts an exemplary III-N nanowire array in accordance with various embodiments of the present teachings.

FIG. 3 is a schematic for an exemplary III-N nanowire array in accordance with the present teachings. The exemplary GaN nanowire 330 can have high quality (e.g., essentially free of threading defects) and large scale uniformity of position, crystallographic orientation, length, cross-sectional features (e.g., the dimensions and/or shapes). For example, the GaN nanowire 330 can have single crystal GaN with a diameter ranging from about 200 nm to about 300 nm. In addition, the nanowire sidewall facets can be of the non-polar family, which creates an opportunity for eliminating the quantum confined Stark effect (QCSE) from LEDs by using a radial, core-shell LED geometry.

Figure 4:
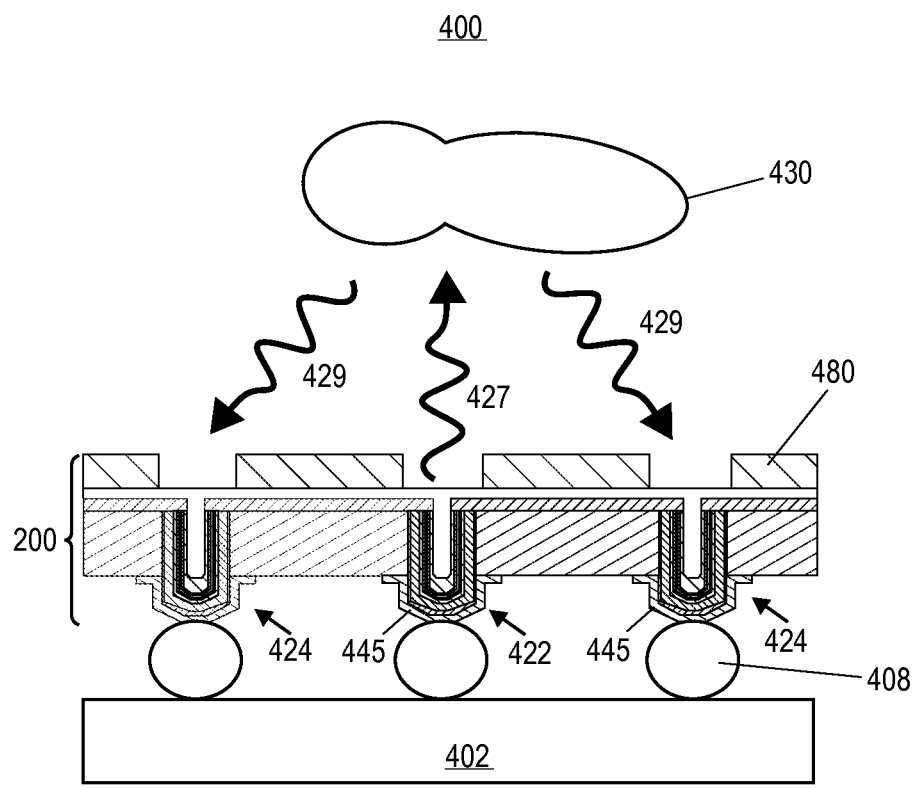
FIG. 4 depicts an exemplary microscope imaging system in accordance with various embodiments of the present teachings.

FIG. 4 depicts an imaging system 400 of an exemplary microscope device having the nanowire LED structure of FIG. 2 in accordance with various embodiments of the present teachings. It should be readily apparent to one of ordinary skill in the art that the system 400 depicted in FIG. 4 represents a generalized schematic illustration and that other nanowires/LEDs can be added or existing nanowires/LEDs can be removed or modified.

As shown in FIG. 4, the microscope system 400 can include, for example, an LED array having a plurality of nanowire LEDs 200 as described in FIG. 2. The plurality of nanowire LEDs 200 can include an exemplary "on" light emitter 422 and two LED light detectors 424 as examples. Each nanowire LED can include a p-side electrode 445 and an n-side electrode 480. An ROIC 402 can be connected to the plurality of nanowire LEDs 200 through, for example, a plurality of conductive structures 408.

During the exemplary reflection type operation, the LED 422 can be an "on" emitter to illuminate a small area of the sample object 430. The emitted light 427 from the "on" light emitters 422 can then be reflected, scattered and/or diffracted from the sample object 430 and the returned light or reflected light 429 can be collected immediately by the surrounding LED light detectors 424 as illustrated.

The photocurrent from the light detectors 424 can be summed by the ROIC 402 and transferred to a control computer (not shown) fixing the intensity of an image pixel. By repeating such process, a pixel-to-pixel magnified image of the sample object 430 can then be built. In various embodiments, the device configuration, the ROIC circuit board, the operation process, along with the data process shown in FIG. 4 can be similar to that described in FIGS. 1A-1B.

In various embodiments, the microscope light emitter array in FIGS. 1A-1B and FIG. 4 can include a planar LED in accordance with the present teachings. The planar LED light emitter array can be fabricated using a "top-down" fabrication process as illustrated in FIGS. 5A-5D in accordance with the present teachings. Specifically, FIGS. 5A-5D depict another exemplary light emitter array 500 at various stages of fabrication in accordance with the present teachings. The planar LED array can include any III-V based LEDs such as GaN-based LEDs.

While the disclosed exemplary fabrication process is illustrated and described below as a series of acts or events, it will be appreciated that the present invention may not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings.

Figure 5A:
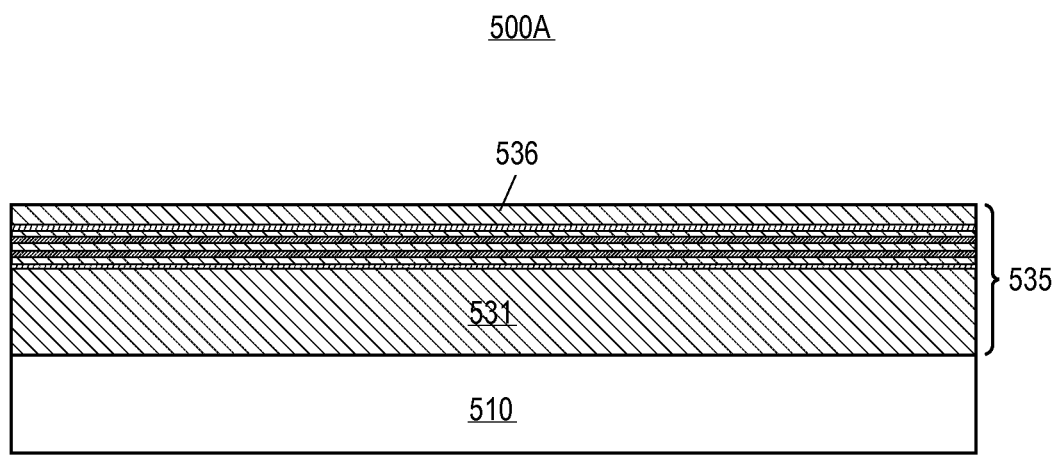
FIGS. 5A-5D depict an exemplary planar LED structure having an LED array at various stages of fabrication in accordance with various embodiments of the present teachings.

In FIG. 5A, an exemplary MQW epitaxial layered LED structure 500A can be formed using methods known to one of ordinary skill in the art. For example, the MQW LED structure 500A can include a substrate 510 and a layered MQW structure 535. In various embodiments, the dopants and the materials used for each layer of the LED structure 500A can be similar as those described above for FIG. 2 and FIG. 4. In an exemplary embodiment, the layered MQW structure 535 can include an InGaN based MQW active region disposed between an n-doped GaN layer 531 and a p-doped AlGaN layer. P-doped GaN layer 536 can be formed over the p-doped AlGaN layer over the InGaN based MQW active region. The n-doped GaN layer 531 can be formed on the substrate 510.

Figure 5B:
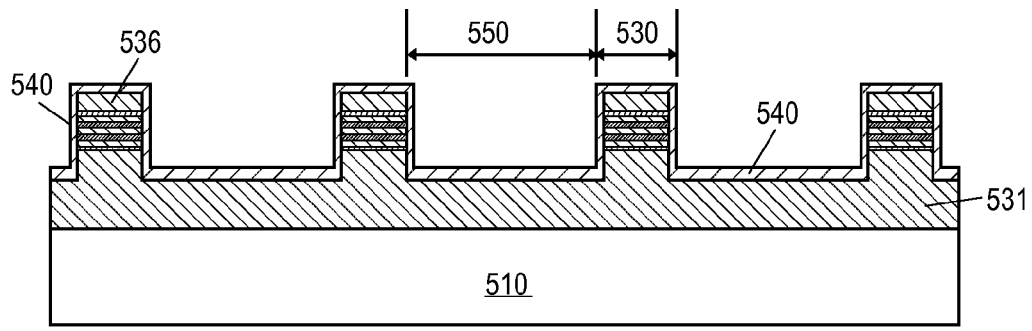

In FIG. 5B, a plurality of LED mesas 530 can then be defined by etching the structure 500A to the n-doped GaN layer 531 and having recessed spaces 550 between any two adjacent LED mesas. In various embodiments, during this etching, the etching damage can be minimized and thereby providing a small diameter, for example, about 5 microns or less, of each LED and rendering the proximity of the LED active region an etched-mesa sidewall-surface. Several suitable strategies can be used for minimizing such damage. For example, an RIE (reactive ion etch) etching process can be first conducted and followed by a passivation process to the RIE damage. This is because the RIE process can damage the surface and subsurface of the mesa sidewalls, although the RIE process can provide a shape control to the LED mesas. The passivation process can then be performed by either a wet-etch treatment, a surface passivation layer 540, or by both of these. The surface passivation layer 540, for example, a dielectric layer including such as silicon nitride, can be formed on the entire surface of the etched structure 500A including the LED mesas and the recessed spaces between the LED mesas. In various embodiments, the etching process can include, for example, standard ICP (i.e., inductively coupled plasma) mesa etch techniques known to one of ordinary skill in the art.

In various embodiments, the dimensions of the LED mesas 530 and the recessed spaces 550 can determine the pitch p of the microscope array (e.g., configured similarly as in FIGS. 1A-1B and FIG. 4) and thus determine the resulting image resolution. For example, if an LED array is designed to have a pitch p of about 20 microns, the LED mesa diameter/width can be etched to be about 5 microns leaving a recessed space 550 of about 15 microns wide between adjacent mesas 530. In various embodiments, the recessed space can provide a sufficient space to subsequently run, e.g., the n-side contact metal contacts out to the edges of the microscope device/chip.

Figure 5C:
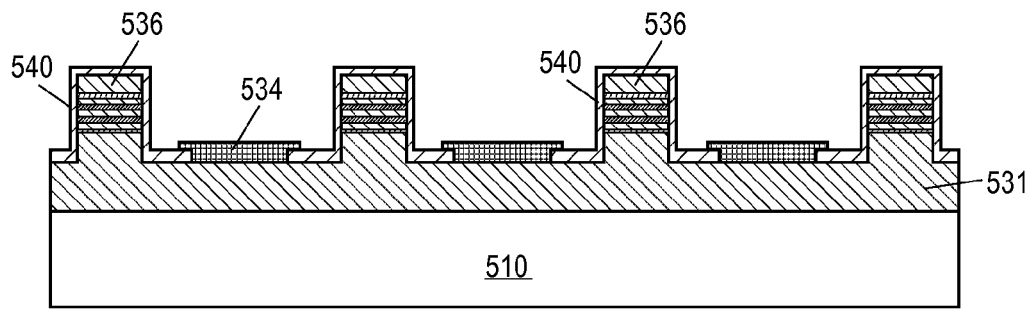

In FIG. 5C, the passivation layer 540 within the recessed spaces 550 can then be patterned by photolithography and etched to allow deposition and definition of a plurality of n-side metal contacts 534. These lower n-side contacts 534 can thus be connected to a first doped layer 531, e.g., an n+ GaN layer, of the layered MQW structure 535 and can run as stripes that are perpendicular to the plane of the FIG. 5C page.

Figure 5D:
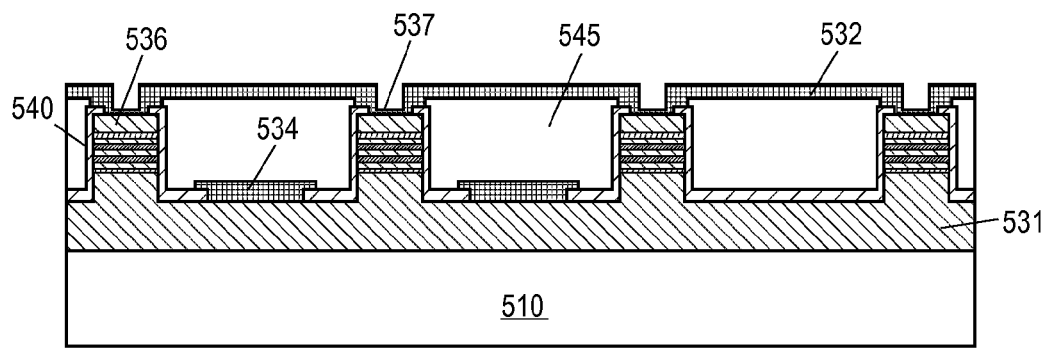

In FIG. 5D, the n-contacts 534 can be buried, for example, under a spin-on, curable and etchable dielectric material 545 that completely fills the recessed space 550 between the mesas 530 (also see FIG. 5B-5C). The passivation layer 540 and spin-on-dielectric 545 can then be patterned by photolithography and etched to allow deposition and definition of the p-side metal contact stripes 532. The lithographically defined p-side electrode recess 537 in the p-side metal 532 can keep the metal transparent over the central part of each LED mesa to allow light emission. The p-side metal contact 532 can be in the form of stripes and can run in a direction parallel to the plane of the figure page, e.g., in a direction of left-to-right. This can create an X-Y contact array where each stripe can be accessible at the edge of the microscope "chip" and all LEDs in the array can be individually addressable.

FIGS. 6A-6G depict another exemplary microscope device at various stages of fabrication in accordance with various embodiments of the present teachings.

Figure 6A:
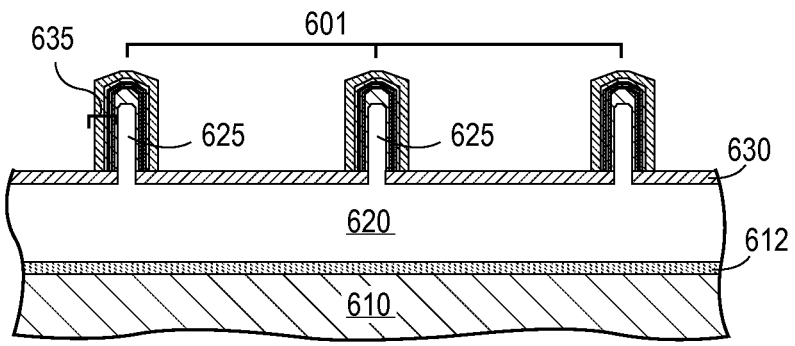
FIGS. 6A-6F depict another exemplary microscope device at various stages of fabrication in accordance with various embodiments of the present teachings.

In FIG. 6A, the device 600A can include an exemplary array 601 of core-shell structures with each core-shell structure having a layered shell 635 formed on the sidewalls of each nanowire 625 to envelop the nanowire. The nanowire 625 can be doped and can be used as a core structure configured coaxially with the layered shell 635.

The device 600A can also include a growth mask dielectric 630 formed on a doped buffer layer 620. The doped buffer layer 620 can be formed over a substrate 610. Each nanowire 625 of the array 601 can be formed on the doped buffer layer 620 through the growth mask dielectric 630. The growth mask dielectric 630 can be made of dielectric materials as disclosed herein during the formation of the plurality of nanowires and/or nanowire arrays. According to various other embodiments, a conducting metal growth mask, such as, for example, tungsten, can also be used for selectively growing the nanowire array. In embodiments, a second buffer layer 612, doped or undoped, can be optionally formed between the doped buffer layer 620 and the substrate 610.

In embodiments, the core-shell structure of the array 601 can be the same as the nanowire-based core-shell structure of the light emitter 200 depicted in FIG. 2, although in embodiments the materials and the conductivities used for each layer of FIGS. 2 and 6A can be different. In embodiments, the core-shell structure array 601 can include the nanowire-based core-shell structures as described in the related U.S. patent application Ser. No. 11/684,264, entitled "Pulsed Growth of Catalyst-Free Growth of GaN Nanowires and Application in Group III Nitride Semiconductor Bulk Material," which is hereby incorporated by reference in its entirety.

Figure 6B:
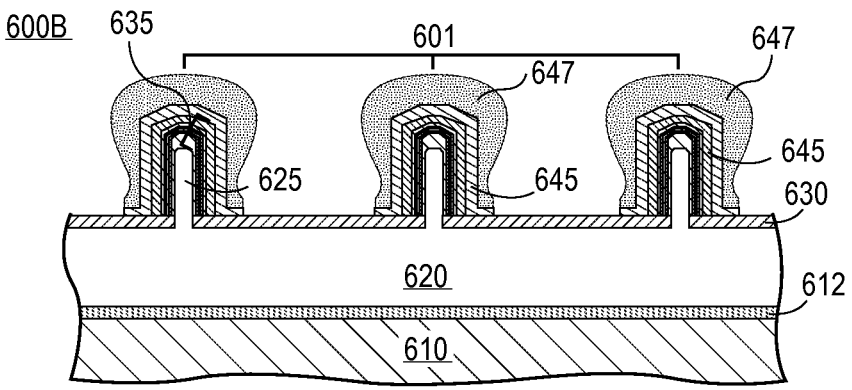

In FIG. 6B, a p-side semiconductor 645 can be formed on the shell surface of each core-shell structure of the array 601 in FIG. 6A. For example, the p-side semiconductor 645 can be formed by depositing a semiconductor layer (not shown) on the entire surface of the device 600A of FIG. 6A and then patterning the semiconductor layer to form the plurality of p-side semiconductors 645 each enveloping the layered shell 635. The p-side semiconductor 645 can also cover surface portions of the selective growth mask 630 that are adjacent to the shell structure 635. In embodiments, a second p-side electrode 647 can be formed on the p-side semiconductor 645, e.g., by depositing one or more metals or by continuously growing the p-side semiconductor 645. The p-side electrode 647 can be geometrically isolated from adjacent p-side electrodes 647.

Figure 6C:
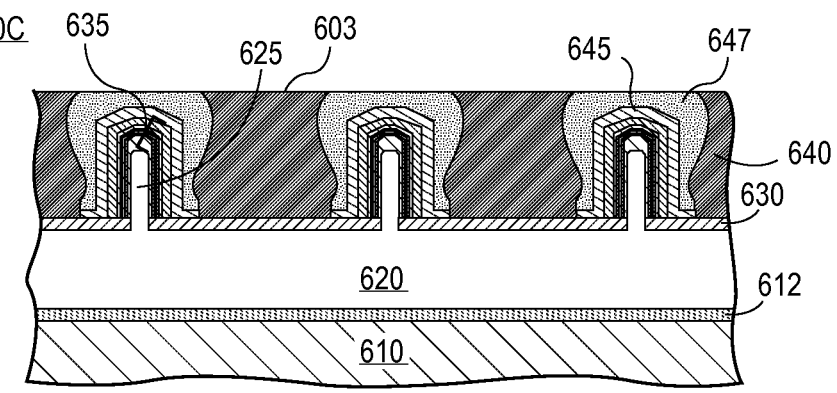

In FIG. 6C, dielectric material 640 can be deposited to fill the gap between the second p-side electrodes 647 disposed on core-shell structures of the array 601 for an electrical isolation. In embodiments, the device 600C can also include a planarized surface 603 formed of the electrodes 647 and the dielectric material 640 and processed by, e.g., chemical mechanical planarization (CMP) or other suitable planarization methods.

Figure 6D:
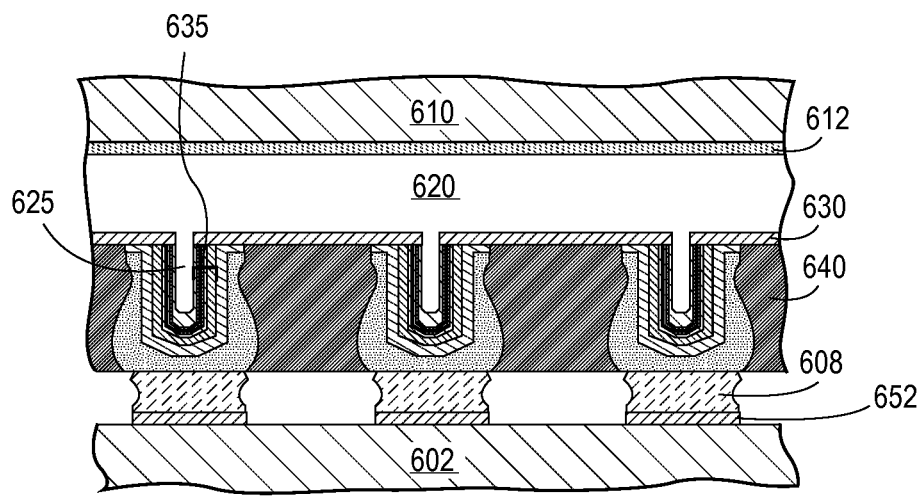

In FIG. 6D, the device 600C of FIG. 6C can be inverted to attach its planarized surface 603 to a read out integrated circuit (ROIC) 602 (also see 102 of FIG. 1B and/or 402 of FIG. 4), such as a printed circuit board (PCB). For example, each p-side electrode 647 can be electrically connected to a corresponding bond pad 652 on the ROIC 602 through conductive structures 608. The conductive structures 608 can be formed by, such as, for example, solder balls, indium bump-bonds, metals, or other conductive structures as known in the art.

In embodiments, by controlling the bonding methods, composition, and/or annealing process of the conductive structures 608, a stress free or strain free bonding between each p-side electrode 647 and the ROIC 602 can be obtained. The stress/strain free bonding is important because residual stress/strain generated in the conductive structures or bump bonds may crack and therefore damage the final LED structure.

Figure 6E:
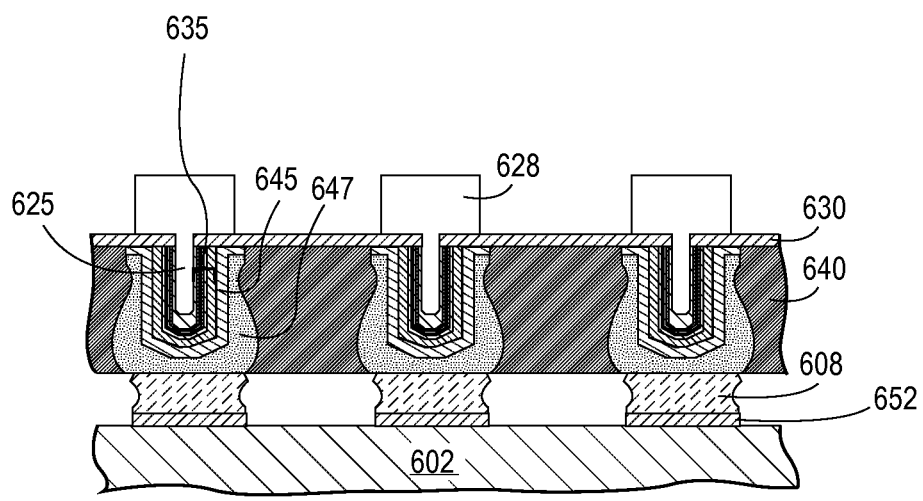

The substrate 610, for example, a sapphire substrate, can then be removed from the device 600D by techniques known to one skilled in the art, to expose the doped buffer layer 620. The exposed doped buffer layer 620 can then be patterned to form a plurality of n-side semiconductors 628 as shown in FIG. 6E. The n-side semiconductors 628 can remain connected with the nanowire core 625 and situating on surface portions of the growth mask dielectric 630. The n-side semiconductors 628 can be geometrically isolated with each other at this stage.

Figure 6F:
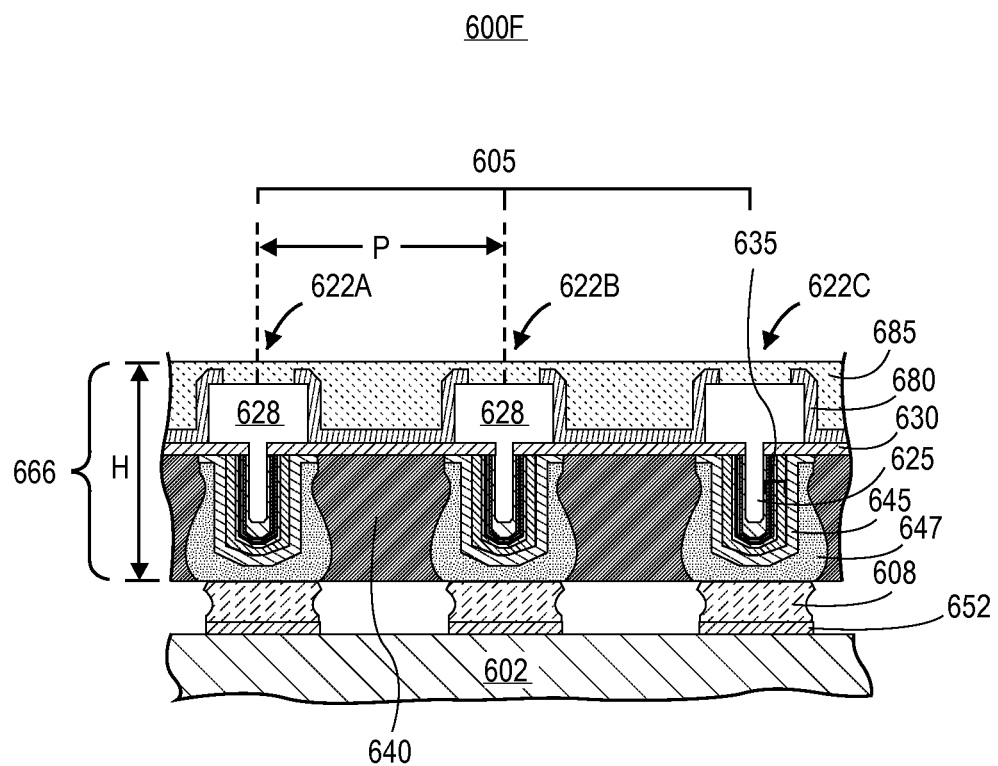

In FIG. 6F, n-side electrodes 680 can be formed by depositing an electrode material such as metal(s) on the entire surface of the device 600E in FIG. 6E, followed by a patterning process to expose a portion of each n-side semiconductors 628. The device 600F can also include a second dielectric layer 685 deposited to cover the entire surface of the device, e.g., to cover the n-side electrodes 680 and the exposed n-side semiconductors 628. The n-side electrodes 680 can be formed to assure the conduction between the n-side semiconductor 628 and the central conductive region including the nanowire core 625.

In this manner, an array of LED structures 666 can be formed over the ROIC 602 as shown in FIG. 6F. The LED structure 666 can include an LED array and can be sufficiently thin such that the microscope device 600F can be placed close enough to sample objects for a magnified observation. For example, the LED structure 666 can have a height H ranging from about 2 μm to about 20 μm, e.g., about 6 μm.

The LED structure 666 can include an LED array having a plurality of LEDs 622a-c as shown in FIG. 6F. In embodiments, a pitch p between adjacent LEDs 622a-c can, e.g., range from about 1 μm to about 100 μm, to provide desired optical resolution. In embodiments, the pitch p can be determined by dimensions of the LEDs 622a-c, e.g., the sidewall electrode thickness, and/or by dimensions of interconnect width between adjacent conductive bond pads 652 on the ROIC 602, which can in turn be defined by the LED current that is required.

Each LED 622a-c can be electrically connected to the ROIC 602 and can include the core-shell structure 635, the n-side semiconductor 628, the n-side electrode 680, the p-side semiconductors and electrodes 645-647, as shown in FIG. 6F. In embodiments, the n-side electrodes 680 and the p-side electrodes 647 can use an absorbing metal that is thick enough to reduce or avoid light leakage between adjacent LEDs. The absorbing metal can include, for example, gold, or alloys of gold, or other metals known by one of ordinary skill in the art to form ohmic contacts to the semiconductor material that they are contacting. Eliminating the light leakage in this way can increase the signal-to-noise ratio (S/N ratio) of the LED detectors. For example, an absorbing metal gold can have an index at blue ($\lambda$=450 nm) of about 1.4 to about 1.88 and can have an absorption coefficient of about 0.0525 nm$^{-1}$ ($4\pi k/\lambda$). A gold film will have a transparency ($I/I_0$) of $I/I_0 = 10^{-0.0525t}$, where t is film thickness in nanometer. So, for a 100 nm thick gold film the transparency can be about $5.6 \times 10^{-6}$.

In embodiments, each of the p-side electrode 647 and the n-side electrode 680 can have an average thickness ranging from about 100 nm to about 500 nm, although the thickness of the p-side electrode 647 or the n-side electrode 680 is not limited.

In embodiments, the growth mask dielectric 630 (see FIGS. 6A-6F) can have a thickness sufficient to provide isolation between LEDs 622a-c and to avoid electrical leakage across the selective growth dielectric 630. For example, breakdown field for exemplary SiNx thin films is about 3 MV/cm. A 30 nm SiNx will then breakdown at 9V. Breakdown field for SiNx thin films having a thickness of about 100 nm can be about 30V. In embodiments, the growth mask dielectric 630 can have a thickness of about 30 nm or greater, e.g., about 100 nm or greater. In embodiments, the integrity of this dielectric layer can be independently checked by, e.g., a test structure on the mask-set that is processed during fabrication of the LED.

Figure 7:
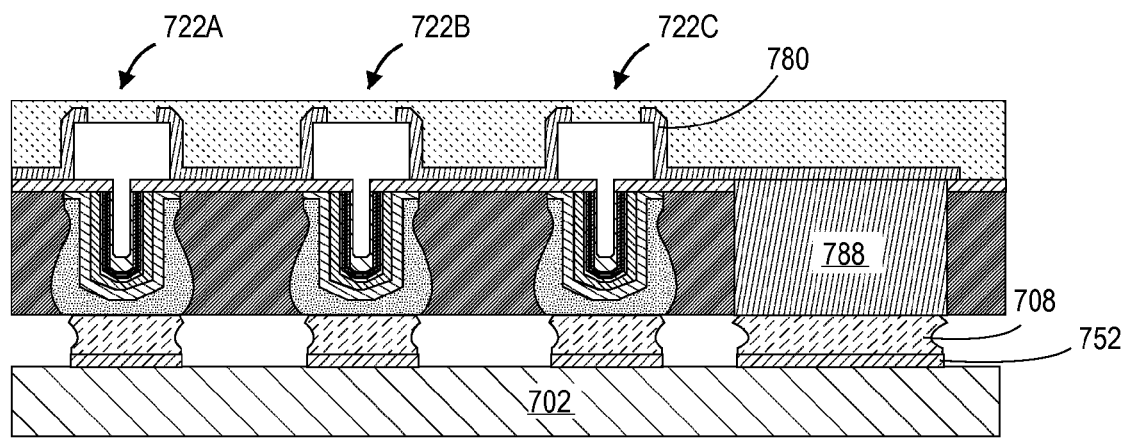
FIG. 7 depicts a portion of an exemplary microscope device in accordance with various embodiments of the present teachings.

In embodiments, a common contact can be used for the n-side electrodes 680 or the p-side electrodes 647 of the LED array 605, for example, as shown in FIG. 7. FIG. 7 depicts an exemplary microscope device 700 formed according to FIGS. 6A-6F in accordance with various embodiments of the present teachings.

As shown, the n-side electrode contacts 780 of the plurality of LEDs 722 a-c can be connected with each other through a large VIA contact 788. The large contact 788 can allow ROIC 702 to connect to the common LED n-side electrodes through a conductive structure 708 and a bond pad 752 as shown.

FIGS. 8A-8B depict exemplary microscope imaging systems in accordance with various embodiments of the present teachings.

As shown in FIG. 8A, the imaging system 800A can include an LED array 805 having LEDs 822a-f, for example. The imaging system 800A can be used to observe and image a sample object 830. In an exemplary embodiment for producing a magnified image (also see FIG. 4), a first image pixel can be formed by switching on a first exemplary LED 822c of the LED array 805 to illuminate a first portion of a sample object 830 through an emitted light 827 from the LED 822c. The emitted light 827 from the "on" light emitter 822c can then be reflected, scattered and/or diffracted from the sample object 830 and the returned light or reflected light 829 can be detected and collected immediately by a first plurality of LEDs 822b and 822d surrounding the first LED 822c.

Likewise, a second image pixel can be formed by switching off the first LED 822c and switching on, for example, a second LED 822b to illuminate a second portion of the sample object 830 and using a second plurality of LEDs 822a and 822c that surrounds the second LED 822b to collect a reflected light from the illuminated second portion of the sample object 830.

The photocurrent detected by the LED light detectors can be summed by the ROIC 802 and transferred to a control computer 855 to fix the intensity of each image pixel. By repeating such process, a pixel-to-pixel magnified image of the sample object 830 can be built. The control computer 855 can, for example, receive image data and can include data handling algorithms.

FIG. 8B depicts another exemplary imaging system in accordance with various embodiments of the present teachings. In this example, double-sided imaging can be performed by using two microscope devices to illuminate and detect one sample object 830. For example, a second microscope device 800B including an LED array 805B can be placed above the first device 800A having an LED array 805A. The LED array 805B can include a plurality of LEDs 822m-822r. The LED array 805B can be a detector array having a detector pitch p that is identical to the pitch p of the LED array 805A.

The two microscope devices having LED arrays 805A-B can be configured in parallel or forming an angle such that both of them can be exposed to the sample object 830. In an exemplary embodiment for a parallel configuration, the spacing between the underlying LED array 805A and the overlying detector array 805B can be adjusted to define a sample channel. In embodiments, the height of this channel can further be adjusted to provide a degree of filtering of a specimen, allowing only objects with a size smaller than the channel height to enter the viewing area. For example, the channel can have a height ranging from about 10 µm to about 100 µm, although other height ranges can be included. Such configuration shown in FIG. 8B can provide high image resolution e.g., ranging from about 1 µm to about 100 µm; and can be used, for example, to create pseudo-3D microscope images.

During an imaging operation, exemplary LED 822c can be turned "on" to illuminate a portion of the sample object 830 providing reflected light 829 and transmitted light 823. The reflected light 829 from the illuminated portion of the sample object 830 can be collected by LEDs 822b and 822d surrounding the LED 822c. The transmitted light 823 through the illuminated portion of the sample object 830 can be detected and collected by corresponding LEDs 822n, 8220, and 822p of the second LED array 805B to form a first image pixel. As similarly described in FIG. 8A, another image pixel can be formed by switching off the LED 822C but switching on other LEDs and using surrounding LEDs of the first LED array 805A to collect the reflected light from the illuminated sample object and using corresponding LEDs of the second LED array 805B to collect transmitted image information from the sample object.

Likewise, the photocurrent detected each time by switching on different LEDs can be summed by the ROIC 802A and 802B, and both transferred to a control computer 855 to fix the intensity of each image pixel. By repeating such process, a pixel-to-pixel magnified image of the sample object 830 can be built and/or displayed on the control computer 855. In embodiments, the double-sided imaging configuration can create a channel for liquid samples (e.g., biological cells suspended in an aqueous solution) by adjusting the spacing between the two microscope devices. In various embodiments, the device configuration, the ROIC circuit board, the operation process, along with the data process shown in FIGS. 8A-8B can be similar to that described in FIGS. 1A-1B and FIG. 4.

In embodiments, when using either the single-sided (FIG. 8A) or double-sided microscope (FIG. 8B) the ability to control in real time, which pixels are active, allows the disclosed microscope to replicate the "fovea" function that is a key feature of human vision. At the control computer, the user can select which part, or parts, of the full image field are of interest. The microscope can then activate only those pixels (LEDs) required to view that part(s) of the image field. This imaging strategy can avoid collecting redundant data, which helps to reduce the data rate flowing from the microscope to the control computer thereby keeping the data rate more manageable. In this manner, the real-time selection and focusing of only a portion of the full image field can replicate the action of the fovea in human vision.

Another embodiment of the present disclosure is directed to a phase-coupled array of nanowire lasers and method for fabricating the same. The fabrication of the array of nanowire lasers builds on the LED (light emitting diode) fabrication process that was taught above with respect to FIGS. 6A to 6F, with some differences that will be discussed below.

When a nanowire LED is operated at high current density, the light output of the LED will change from spontaneous to stimulated emission. That is, the nanowire LED will become a nanowire laser. The array geometry that was taught above with respect to FIGS. 6, 7 and 8 of the present disclosure can be modified as described below to produce a phase-coupled laser. Adjacent nanowire lasers in this structure can share part of their light output, which can result in a definite phase relationship between the lasing action in adjacent nanowire lasers. In practice this leads to the adoption of the same phase within adjacent lasers and is known as phase-coupling. Optimum phase-coupling will allow all or substantially all nanowire lasers within a massive array to emit with the same phase such that the total light output can be at a very high power. In essence, the array behaves as if it were a single, large-aperture laser.

With reference to FIG. 6F it can be seen that lateral light-leakage (or light-sharing) can potentially occur either by lateral transmission through the contact metals 680 and 647, or by lateral transmission along the transparent dielectric layer 630. In the microscope embodiments discussed above, it was determined to be beneficial not to allow light leakage between adjacent nanowire LEDs, as this leakage reduced the signal-to-noise ratio of the microscope. In the case of the microscope embodiments, the elimination of light-leakage was achieved by increasing the thickness of the metal contacts 680 and 647 (to make them absorbent to lateral light transmission) and by minimizing the thickness of the dielectric layer 630 to minimize the amount of light transmitted along this transparent dielectric layer. It was calculated that a metal thickness of approximately 100 nm would be sufficient to reduce the light intensity transmitted through the metals 680 and 647 to an acceptably low value of $<5.6\times10^{-6}\times I_0$, where $I_0$ was the maximum light intensity within the nanowire. The minimum thickness of the dielectric layer 630 was determined by the trade-off between reducing this thickness in order to reduce light leakage, and the need for this dielectric layer 630 to have sufficient thickness such that it also acted as an electrical stand-off between the positive and negative terminals of the nanowire devices. For the microscope embodiments this trade-off results in a dielectric layer (630) thickness of 150 nm.

For the phase-coupled laser-array, on the other hand, it is beneficial to share light between the adjacent nanowire laser devices. This can not be achieved by light transmission through the contact metals 680 and 647, as these will need to be made relatively thick, such as, for example, thicker than 100 nm, to avoid undesirable parasitic-resistance effects at the increased operating current density employed for lasing operation. These undesirable parasitic-resistance effects include voltage-drops across the metal contacts, Joule heating in the contact region, and electromigration. The undesirable parasitic-resistance effects in the contact metals 680 and 647 can be avoided by increasing the metal thickness and by additional processes known to those skilled in the art of semiconductor metallization. While light sharing through the contact metals is not an option, the light sharing can be achieved by increasing light transmission along the dielectric layer 630 (FIG. 9).

Figure 9:
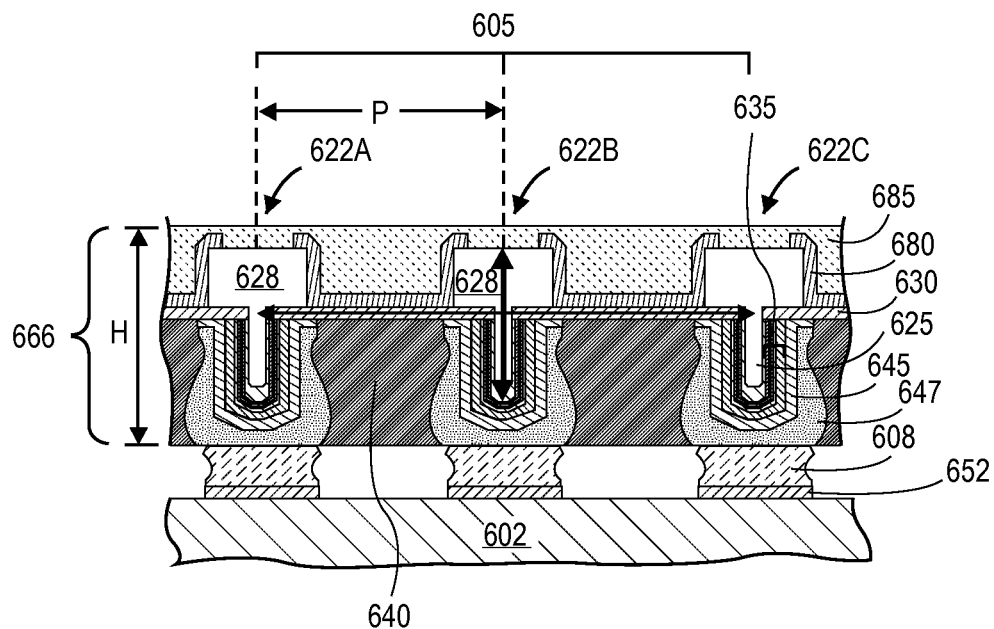
FIGS. 9 and 10 illustrate phase-coupled nanowire laser arrays, according to embodiments of the present disclosure.

In an embodiment, the device of FIG. 9 can be similar to that of FIG. 6F, except that the thickness of dielectric 630 is chosen to provide sufficient light transmission between the devices. Calculations and modeling at UNM indicate that with a dielectric layer thickness of 150 nm, the amount of light leakage can be up to 2% of $I_0$. The precise amount of light leakage required to ensure stable phase coupling is unknown, and it may be that dielectric layer thicknesses of 150 nm or less, are sufficient to produce a desired degree of phase coupling. That said, the ability to increase the light coupling from 2% upwards, by increasing the thickness of 630 to greater than 150 nm, may provide for adequate or improved coupling to be established. Additional methods of increasing light-sharing via the dielectric layer 630 are available and can be employed instead of, or in addition to, increasing the thickness of dielectric 630. These include changing the dielectric material used for 630 and tuning the thickness of this layer such that it becomes a waveguide at the laser operating frequency.

In an embodiment, the dielectric thickness can be chosen to allow the desired light leakage to occur. In an embodiment, the thickness can range from about 100 nm to about 5000 nm. Further examples of suitable thicknesses range from about 150 nm to about 4000 nm, such as about 160 nm, 170 nm, 180 nm, 200 nm, 250 nm or 300 nm to about 500 nm, 1000 nm, 1500 nm, 2000 nm, 2500 nm or 3000 nm. The thickness may depend on the material employed for the dielectric, the ability of the laser light to be transmitted by the particular material, as well as other factors.

The dielectric can comprise any dielectric material suitable for transmitting laser light. Examples of suitable materials include silicon dioxide ($SiO_2$), silicon nitride ($Si_3N_4$), silicon oxynitride, fluorinated silicon dioxide, silicon oxycarbide, hafnium oxide ($HfO_2$), hafnium-silicate, nitride hafnium-silicate, zirconium oxide ($ZrO_2$) and aluminum oxide ($Al_2O_3$). Given the guidance provided in the present disclosure, choosing a dielectric material and/or thickness that will provide sufficient light for coupling is within the capabilities of one of ordinary skill in the art.

It is believed that this integrated approach to phase-coupling may be advantageous by comparison with previous approaches, which have used external (non-integrated) components that make the overall system prone to drift and instability. In embodiments of the present disclosure, the coupling pathway is robustly integrated into the laser structure, which can promote improved stability of operation.

During operation of the device of FIG. 9, most of the light (thick, vertical arrow) remains within the nanowire lasing cavity and contributes to lasing action. A relatively small amount of the light (thin, horizontal arrows) is shared between nanowires by leakage along the dielectric layer 630. In practice one nanowire will be slightly brighter and will dominate the process. That is, one nanowire will become the master oscillator and the rest of the nanowire lasers will be synchronized to this master oscillator.

Figure 10:
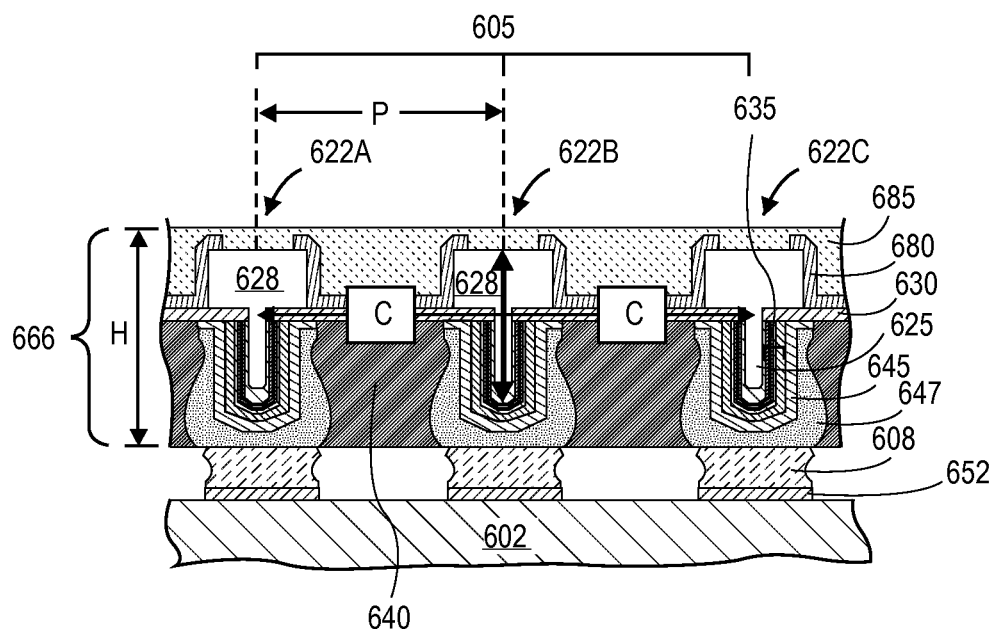

In an embodiment, devices of the present disclosure can incorporate an integrated phase-control element. An example of integrated phase-control element C is illustrated in FIG. 10, where part of the dielectric 630 is replaced by an active element that controls the phase and, if desired, the amplitude of the shared light. Such elements provide electrical control of the phase-coupling action and may allow the combined laser beam to be stabilized and steered electrically, with no moving parts in the system. An example of an integrated phase-control element would be a region of semiconductor which is biased separately from the nanowire devices, and where the refractive index will vary with the bias current flowing through this region of semiconductor. Such an integrated element C would allow fine adjustment of the intensity and phase of the light that is coupled between adjacent nanowire lasers. Additional electrical contacts needed to operate the phase control units C are not shown, but can be fabricated by standard semiconductor process techniques known to one skilled in the art.

In an embodiment, a control computer can be electrically coupled to the array of nanowire lasers in any suitable manner. For example, the electrical coupling can be accomplished similarly as shown for control computer 155 in FIG. 1B, described above. The control computer can be used to operate the phase-coupled laser-array. Software for the control computer can be configured to provide control and/or optimization of laser operation. For example, software can be employed to optimize the phase coupling for the maximum total laser output and/or to steer the laser using the control element C to change phase between adjacent nanowires in the array. The physics for beam steering in this manner is well known and one of ordinary skill in the art would readily be able to write and implement the computer control algorithms for controlling the laser array in this manner. For instance, the beam angle relative to the vertical direction in FIG. 6, 9 or 10 is "φ", where:

$$\cos\phi = n\lambda/n\lambda + \delta \quad (1)$$

and "λ" is the laser wavelength, n is an integer, and "δ" is a small fraction of a wavelength. By using the control elements C to purposefully add an exact and non-integer value of phase "nλ+δ" between adjacent nanowire emitters, the beam direction "φ" can be changed or "steered". The mathematical relationship of equation 1 is generally well known for such beam steering applications.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An array of nanowire devices, comprising:
   a readout integrated circuit (ROIC); and
   a light emitting diode (LED) array disposed on the ROIC; the LED array comprising:
   a plurality of LED core-shell structures, with each LED core-shell structure comprising a layered shell enveloping a nanowire core, wherein the layered shell comprises a multi-quantum-well (MQW) active region;
   a p-side electrode enveloping the layered core-shell structure and electrically connecting the ROIC, wherein each p-side electrode has an average thickness ranging from about 100 nm to about 500 nm; and
   a dielectric disposed on the plurality of LED core-shell structures, with each nanowire core disposed through the dielectric to connect with an n-side semiconductor that is situated on the dielectric,
   wherein each nanowire device is configured to exhibit lasing action, and further wherein the dielectric is configured to transmit light emitted during operation of the array of nanowire devices between adjacent LED core-shell structures.

2. The array of claim 1, wherein the dielectric has a thickness ranging from about 100 nm to about 5000 nm.

3. The array of claim 1, wherein the dielectric comprises at least one material chosen from silicon dioxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$).

4. An array of nanowire devices, comprising:
   a readout integrated circuit (ROIC);
   a light emitting diode (LED) array disposed on the ROIC; the LED array comprising:
   a plurality of LED core-shell structures, with each LED core-shell structure comprising a layered shell enveloping a nanowire core, wherein the layered shell comprises a multi-quantum-well (MQW) active region;
   a p-side electrode enveloping the layered core-shell structure and electrically connecting the ROIC, wherein each p-side electrode has an average thickness ranging from about 100 nm to about 500 nm; and
   a dielectric disposed on the plurality of LED core-shell structures, with each nanowire core disposed through the dielectric to connect with an n-side semiconductor that is situated on the dielectric,
   the array of nanowire devices further comprising a phase control unit configured to change the phase of light transmitted through the dielectric.

5. An array of nanowire devices, comprising:
   a readout integrated circuit (ROIC);
   a light emitting diode (LED) array disposed on the ROIC; the LED array comprising:
   a plurality of LED core-shell structures, with each LED core-shell structure comprising a layered shell enveloping a nanowire core, wherein the layered shell comprises a multi-quantum-well (MQW) active region;
   a p-side electrode enveloping the layered core-shell structure and electrically connecting the ROIC, wherein each p-side electrode has an average thickness ranging from about 100 nm to about 500 nm; and
   a dielectric disposed on the plurality of LED core-shell structures, with each nanowire core disposed through the dielectric to connect with an n-side semiconductor that is situated on the dielectric,
   the array of nanowire devices further comprising a control computer electrically connected to the ROIC, wherein a software program run on the control computer is configured to optimize phase coupling between nanowire devices of the array for increasing total laser output.

6. An array of nanowire devices, comprising:
   a readout integrated circuit (ROIC);
   a light emitting diode (LED) array disposed on the ROIC; the LED array comprising:
   a plurality of LED core-shell structures, with each LED core-shell structure comprising a layered shell enveloping a nanowire core, wherein the layered shell comprises a multi-quantum-well (MQW) active region;

a p-side electrode enveloping the layered core-shell structure and electrically connecting the ROIC, wherein each p-side electrode has an average thickness ranging from about 100 nm to about 500 nm; and a dielectric disposed on the plurality of LED core-shell structures, with each nanowire core disposed through the dielectric to connect with an n-side semiconductor that is situated on the dielectric, the array of nanowire devices further comprising a common n-side electrode contact configured to connect a plurality of n-side electrodes to the ROIC, wherein each of the plurality of n-side electrodes is disposed on the n-side semiconductor.

7. The array of claim 6, wherein each of the p-side electrode and the n-side electrode comprises an absorbing metal for reducing light leakage between adjacent LED core-shell structures, wherein the absorbing metal comprises gold, or gold alloys.

8. The array of claim 1, wherein the LED structure on the ROIC has a height ranging from about 2 μm to about 20 μm, and a pitch p between adjacent LED core-shell structures ranging from about 1 μm to about 100 μm.

9. The array of claim 1, wherein each of the nanowire core, the n-side semiconductor, and the layered shell is formed of a material comprising GaN, AN, InN, InGaN, AlGaN, AlInGaN, InP, or GaAs; and the substrate comprises Si, SiC, sapphire, GaN or GaAs.

10. A method of forming an array of nanowire devices, the method comprising:
    forming a light emitting diode (LED) array comprising a plurality of LED core-shell structures with each LED core-shell structure comprising:
        a doped buffer layer disposed on a substrate,
        a first dielectric disposed on the doped buffer layer,
        a nanowire core formed on the doped buffer layer through the first dielectric, and
        a layered shell formed to envelop the nanowire core, wherein the layered shell comprises a multi-quantum-well (MQW) active region;
    forming a p-side semiconductor to envelop the layered shell of each LED core-shell structure;
    forming a p-side electrode having a thickness ranging from about 100 nm to about 500 nm to envelop the p-side semiconductor;
    filling a second dielectric material between adjacent p-side electrodes for an electrical isolation, providing a surface comprising both the p-side electrodes and the second dielectric material;
    inverting the LED array to attach the surface comprising both the p-side electrodes and the second dielectric material to a readout integrated circuit (ROIC);
    removing the substrate of the LED array to expose the doped buffer layer; and
    patterning the doped buffer layer to form a plurality of n-side semiconductors on the first dielectric, with each n-side semiconductor connecting with the nanowire core of a corresponding LED core-shell structure,
    wherein each nanowire device is configured to exhibit lasing action when operated at a current density that is sufficient to result in stimulated emission of light.

11. The method of claim 10, wherein the dielectric has a thickness ranging from about 100 nm to about 5000 nm.

12. The method of claim 10, wherein the dielectric comprises at least one material chosen from silicon dioxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$).

13. A method of forming an array of nanowire devices, the method comprising:
    forming a light emitting diode (LED) array comprising a plurality of LED core-shell structures with each LED core-shell structure comprising:
        a doped buffer layer disposed on a substrate,
        a first dielectric disposed on the doped buffer layer,
        a nanowire core formed on the doped buffer layer through the first dielectric, and
        a layered shell formed to envelop the nanowire core, wherein the layered shell comprises a multi-quantum-well (MQW) active region;
    forming a p-side semiconductor to envelop the layered shell of each LED core-shell structure;
    forming a p-side electrode having a thickness ranging from about 100 nm to about 500 nm to envelop the p-side semiconductor;
    filling a second dielectric material between adjacent p-side electrodes for an electrical isolation, providing a surface comprising both the p-side electrodes and the second dielectric material;
    inverting the LED array to attach the surface comprising both the p-side electrodes and the second dielectric material to a readout integrated circuit (ROIC);
    removing the substrate of the LED array to expose the doped buffer layer; and
    patterning the doped buffer layer to form a plurality of n-side semiconductors on the first dielectric, with each n-side semiconductor connecting with the nanowire core of a corresponding LED core-shell structure,
    wherein the array of nanowire devices comprises a phase control unit configured to change the phase of light transmitted through the first dielectric.

14. The method of claim 10, further comprising
    forming an n-side electrode on each n-side semiconductor of the plurality of n-side semiconductors,
    forming a VIA contact connecting the plurality of the n-side electrodes, and
    electrically connecting the VIA contact to the ROIC.

15. A method of forming an array of nanowire devices, the method comprising:
    forming a light emitting diode (LED) array comprising a plurality of LED core-shell structures with each LED core-shell structure comprising:
        a doped buffer layer disposed on a substrate,
        a first dielectric disposed on the doped buffer layer,
        a nanowire core formed on the doped buffer layer through the first dielectric, and
        a layered shell formed to envelop the nanowire core, wherein the layered shell comprises a multi-quantum-well (MQW) active region;
    forming a p-side semiconductor to envelop the layered shell of each LED core-shell structure;
    forming a p-side electrode having a thickness ranging from about 100 nm to about 500 nm to envelop the p-side semiconductor, the p-side electrode comprising an absorbing metal having a property of reducing light leakage between adjacent LED core-shell structures of the LED array during operation of the nanowire devices;
    filling a second dielectric material between adjacent p-side electrodes for an electrical isolation, providing a surface comprising both the p-side electrodes and the second dielectric material;

inverting the LED array to attach the surface comprising both the p-side electrodes and the second dielectric material to a readout integrated circuit (ROIC);

removing the substrate of the LED array to expose the doped buffer layer; and patterning the doped buffer layer to form a plurality of n-side semiconductors on the first dielectric, with each n-side semiconductor connecting with the nanowire core of a corresponding LED core-shell structure.

16. A method of operating a phase-coupled array of nanowire devices comprising:

providing an array of nanowire devices of claim 1; and supplying high density power to the array of nanowire devices sufficient to cause the nanowire devices to exhibit phase coupled lasing action.

17. The method of claim 16, wherein the array of nanowire devices comprises adjacent nanowire devices, the method further comprising changing the phase of light transmitted through a dielectric between the adjacent nanowire devices in the array in order to control phase-coupling of the lasing action between the adjacent nanowire devices.

\* \* \* \* \*

UNITED STATES PATENT AND TRADEMARK OFFICE
CERTIFICATE OF CORRECTION

PATENT NO.        : 9,106,056 B1
APPLICATION NO.   : 14/103587
DATED             : August 11, 2015
INVENTOR(S)       : Hersee Page 1 of 1

It is certified that error appears in the above-identified patent and that said Letters Patent is hereby corrected as shown below:

In the claims

Column 19, lines 24-28, Claim 9 should read

9. The array of claim 1, wherein each of the nanowire core, the n-side semiconductor, and the layered shell is formed of a material comprising GaN, AlN, InN, InGaN, AlGaN, AlInGaN, InP, or GaAs; and the substrate comprises Si, SiC, sapphire, GaN or GaAs.

Signed and Sealed this
Ninth Day of February, 2016

Michelle K. Lee
*Director of the United States Patent and Trademark Office*